(12) United States Patent
Wu et al.

(10) Patent No.: US 9,299,612 B2
(45) Date of Patent: Mar. 29, 2016

(54) STACKED STRUCTURES AND METHODS OF FORMING STACKED STRUCTURES

(71) Applicant: Taiwan Semiconductor Manufacturing Co., Ltd., Hsin-Chu (TW)

(72) Inventors: Weng-Jin Wu, Hsinchu (TW); Wen-Chih Chiou, Zhunan Township (TW); Chen-Hua Yu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/251,678

(22) Filed: Apr. 14, 2014

(65) Prior Publication Data

US 2014/0220741 A1  Aug. 7, 2014

Related U.S. Application Data

(62) Division of application No. 11/539,481, filed on Oct. 6, 2006, now Pat. No. 8,736,039.

(51) Int. Cl.
*H01L 29/82* (2006.01)
*H01L 21/78* (2006.01)
*H01L 23/58* (2006.01)
*H01L 25/065* (2006.01)

(52) U.S. Cl.
CPC .............. *H01L 21/78* (2013.01); *H01L 23/585* (2013.01); *H01L 25/0657* (2013.01); *H01L 2225/06513* (2013.01); *H01L 2225/06527* (2013.01); *H01L 2924/0002* (2013.01)

(58) Field of Classification Search
CPC .............. H01L 21/8221; H01L 25/043; H01L 25/0657; H01L 25/074; H01L 25/0756

USPC .......................................... 257/416; 438/612
See application file for complete search history.

(56) References Cited

U.S. PATENT DOCUMENTS

| 5,811,874 | A | 9/1998 | Lee |
| 5,838,050 | A | 11/1998 | Ker et al. |
| 6,157,066 | A | * 12/2000 | Kobayashi .................... 257/363 |
| 6,661,085 | B2 | 12/2003 | Kellar et al. |
| 6,798,022 | B1 | 9/2004 | Kuroda et al. |
| 7,135,718 | B2 | 11/2006 | Kitada et al. |
| 7,238,991 | B2 | 7/2007 | Kuroda et al. |
| 2004/0014308 | A1 | 1/2004 | Kellar et al. |
| 2004/0212047 | A1 | 10/2004 | Joshi et al. |
| 2005/0205984 | A1 | 9/2005 | Chen-Tung et al. |

OTHER PUBLICATIONS

Tanaka, "Low-Cost Through-hole Electrode Interconnection for 3D-SiP Using Room-Temperature Bonding", 2006 Electronic Components and Technology Conference, pp. 814-818.

\* cited by examiner

*Primary Examiner* — Phuc Dang
(74) *Attorney, Agent, or Firm* — Duane Morris LLP

(57) ABSTRACT

A stacked structure includes a first die bonded over a second die. The first die has a first die area defined over a first surface. At least one first protective structure is formed over the first surface, around the first die area. At least one side of the first protective structure has at least one first extrusion part extending across a first scribe line around the protective structure. The second die has a second die area defined over a second surface. At least one second protective structure is formed over the second surface, around the second die area. At least one side of the second protective structure has at least one second extrusion part extending across a second scribe line around the protective structure, wherein the first extrusion part is connected with the second extrusion part.

20 Claims, 17 Drawing Sheets

STACKED STRUCTURES AND METHODS OF FORMING STACKED STRUCTURES

CROSS-REFERENCE TO RELATED APPLICATIONS

This application is a division of co-pending U.S. patent application Ser. No. 11/539,481, filed Oct. 6, 2006, the entirety of which is incorporated by reference herein.

BACKGROUND OF THE INVENTION

1. Field of the Invention

The present invention relates to semiconductor structures and methods of forming the semiconductor structures, and more particularly to stacked structures and methods of forming the stacked structures.

2. Description of the Related Art

With advances associated with electronic products, semiconductor technology has been widely applied in manufacturing memories, central processing units (CPUs), liquid crystal displays (LCDs), light emission diodes (LEDs), laser diodes and other devices or chipsets. In order to achieve high-integration and high-speed goals, dimensions of semiconductor integrated circuits continue to shrink. Various materials and techniques have been proposed to achieve these integration and speed goals and to overcome manufacturing obstacles associated therewith. In order to achieve these targets, stacking technology has been applied to assemble two or more dies together, thereby providing multi-function chips and reducing chip dimensions.

FIG. 1A shows top views of two wafers. Different dies 103 and 113 are formed over wafers 100 and 110, respectively. Bonding pads (not shown) are formed in the dies 103 and 113. The wafers 100 and 110 are can be assembled into stacked structures by bonding the pads formed thereon. In each wafer, the dies 103 and 113 are separated by scribe lines 105 and 115, respectively. After the formation of the dies 103 and 113, the wafer 110 is bonded over the wafer 100 by a bonding step before singulation of the dies along the scribe lines.

FIG. 1B shows a cross-sectional view of the bonded wafers taken along a section line (not shown) which passes through one of the scribe lines 105, 115 shown in FIG. 1A. As shown in FIG. 1B, the wafers 100 and 110 are bonded at the bonding pads 107 and 117 formed over the wafers 100 and 110, respectively. After the formation of the stacked wafers 100 and 110, the backsides of the wafers 100 and 110 are subjected to grinding steps for reducing thicknesses of the wafers 100 and 110. The ground wafers are then subjected to a sawing (singulation) step for obtaining individual stacked dies.

As shown in FIG. 1B, no isolation material is filled between the bonded wafers 100 and 110. When the bonded wafers 100 and 110 are subjected to the grinding steps, such as chemical mechanical planarization (CMP) processing steps, chemicals or particles 109 may flow into the gap between the wafers 100 and 110, to the pads 107 and 117 or die areas (not shown) along scribe lines, resulting in shorts between devices or circuits (not shown) formed in the die areas. In order to solve the problem, some protective structures have been proposed.

FIG. 1C shows top views of two wafers upon which different dies are formed. FIG. 1D shows enlarged dies 123 and 133 shown in FIG. 1C.

Referring to FIG. 1C, dies 123 and 133 are formed over the wafers 120 and 130, respectively. In addition, protective structures 125, 127, 135 and 137 are also formed over the wafers 120 and 130, respectively. The protective structures 125 and 135 are formed, surrounding the dies 123 and 133, respectively. The protective structures 127 and 137 having patterns different from the dies 123 and 133 are formed over the peripheral areas of the wafers 120 and 130, where no integrated circuit, i.e., functional circuit, is formed.

As shown in FIG. 1D, each of the protective structures 125 and 135 comprises a plurality of rings. When the wafer 130 is bonded over the wafer 120, the rings of the protective structures 125 are also aligned and bonded to the corresponding rings of the protective structures 135, and the protective structures 127 are aligned and bonded to the corresponding protective structures 137. By the bonding step, the peripheral areas of the bonded wafers 120 and 130 are divided into many isolated areas separated by the protective structures 127 and 137, each of which is isolated or sealed by the protective structures 127 and 137. Accordingly, when the bonded wafers 120 and 130 are subjected to a CMP step, the protective structures 127 and 137 block chemicals at the circumference of the bonded wafers 120 and 130 and prevent penetration of chemicals to the dies 123 and 133 through the scribe lines. In addition, the bonded protective structures 125 and 135, i.e., rings, surround and individually seal the dies 123 and 133. Therefore, even if the bonded protective structures 127 and 137 fail to properly prevent penetration of chemicals at the peripheral area of the wafers, the bonded protective structures 127 and 137 around individual dies provide another shelter for blocking chemicals.

However, the protective structures 125, 127, 135 and 137 have some shortcomings. As shown in FIG. 1C, the patterns of the protective structures 127 and 137 are different from those of the dies 123 and 133. In other words, at least one additional photo reticle should be provided for patterning the protective structures 127 and 137, and the protective structures 127 and 137 must be formed by processing steps different from those of forming the dies 123 and 135. Accordingly, manufacturing costs and cycle time are increased. In addition, the rings of the protective structures 125 and 135 must be well aligned; otherwise, the rings of the protective structures 125 and 135 cannot connect to each other, and desirably sealed spaces between the rings cannot be formed. Accordingly, misalignment of the protective structures 125 and 135 adversely affects the function of the bonded protective structures 125 and 135.

From the foregoing, stacked structures and methods of forming the stacked structures are desired.

SUMMARY OF THE INVENTION

In accordance with some exemplary embodiments, a stacked structure includes a first die bonded over a second die. The first die has a first die area defined over a first surface. At least one first protective structure is formed over the first surface, around the first die area. At least one side of the first protective structure has at least one first extrusion part extending across a first scribe line around the protective structure. The second die has a second die area defined over a second surface. At least one second protective structure is formed over the second surface, around the second die area. At least one side of the second protective structure has at least one second extrusion part extending across a second scribe line around the protective structure, wherein the first extrusion part is connected with the second extrusion part.

In accordance with some exemplary embodiments, a method of forming stacked structures comprises forming a plurality of first dies over a first surface of a first substrate. At least one of the first dies comprises a first die area and at least one first protective structure around at least one of the first die areas. At least one side of the first protective structure has one first extension part extending to another first protective structure around another first die area adjacent thereto. A plurality of second dies are formed over a second surface of a second substrate. At least one of the second dies comprises a second die area and at least one second protective structure around at least one of the second die areas. At least one side of the second protective structure has one second extension part extending to another second protective structure around another second die area adjacent thereto. The first surface of the first substrate is bonded with the second surface of the second substrate, thereby connecting the first extension part and the second extension part. At least one of the first substrate and the second substrate bonded thereover is thinned. The bonded first substrate and second substrate is diced.

The above and other features of the present invention will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

DESCRIPTION OF THE PREFERRED EMBODIMENT

Figure 1A:
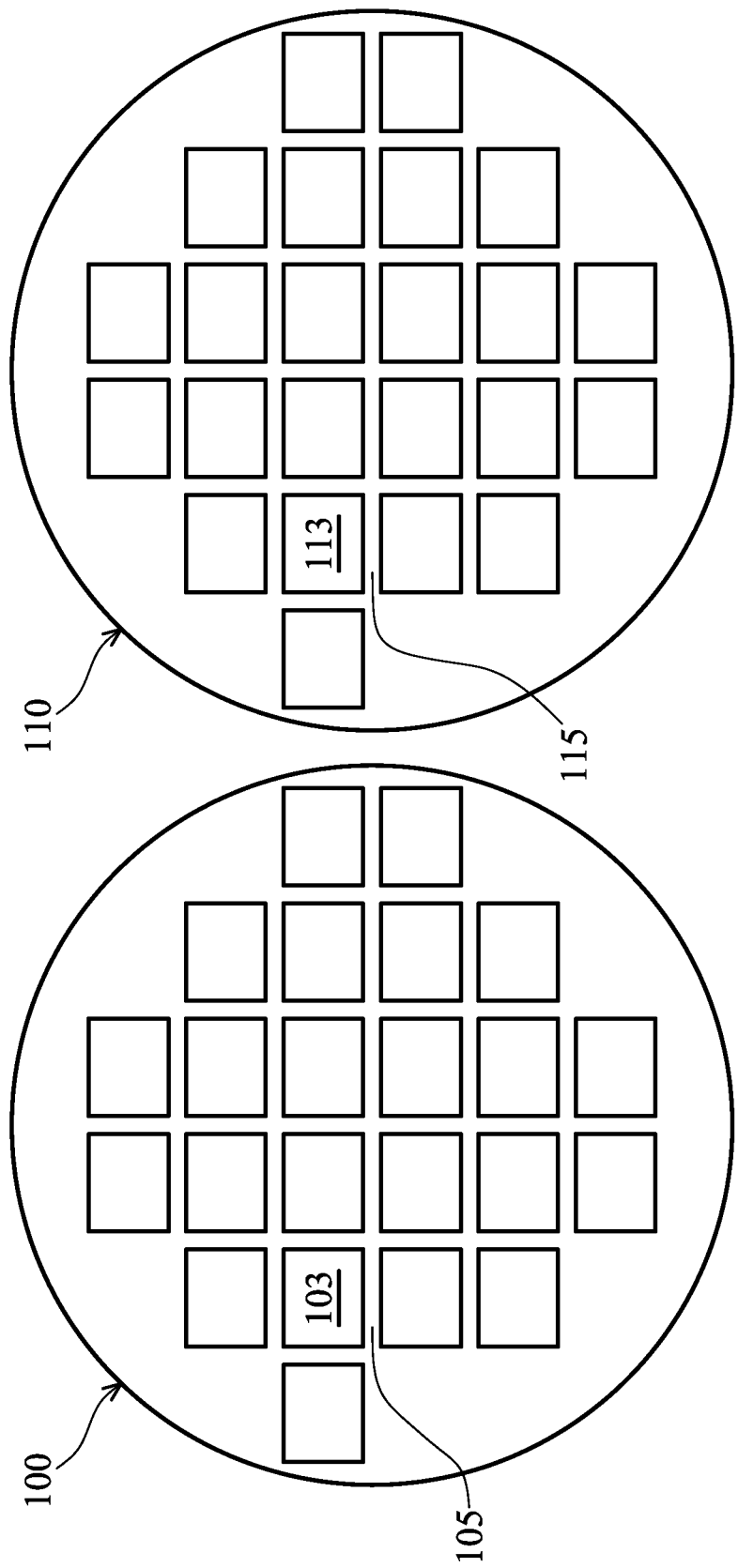
FIG. 1A is a top plan view of two conventional wafers to be stacked.
Figure 1B:
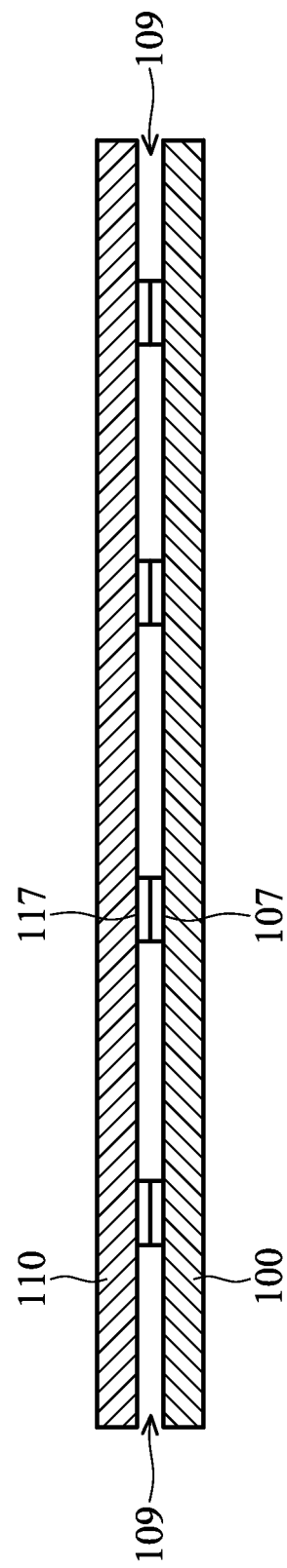
FIG. 1B is a cross-sectional view of the wafers of FIG. 1A after bonding, taken along a section line passing through a scribe line.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Figure 2:
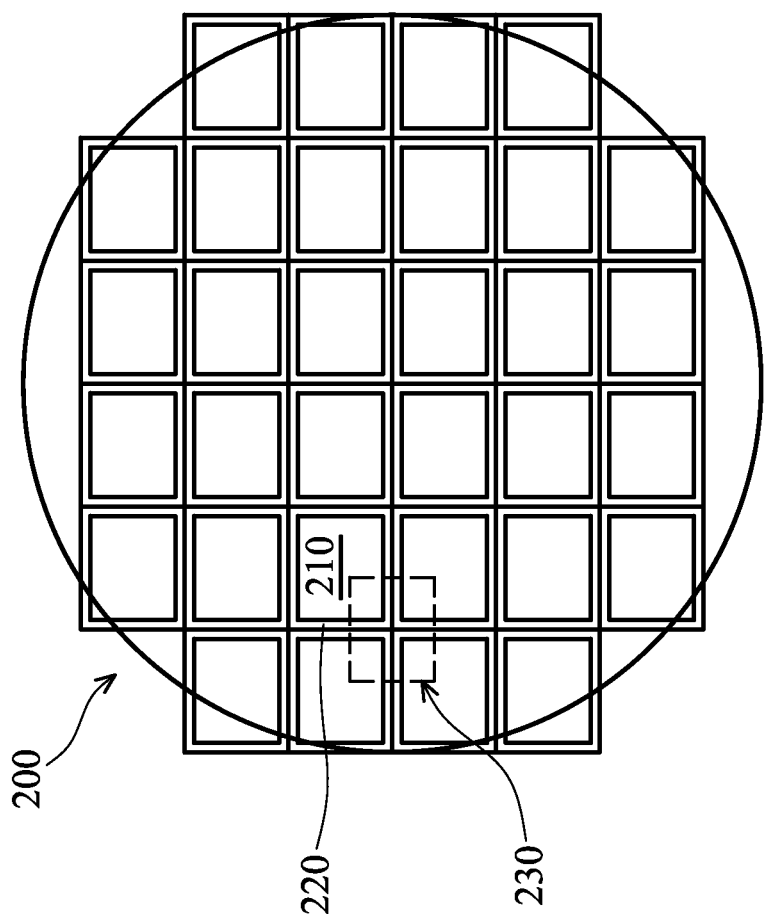
FIG. 2 is a schematic top view showing a plurality of dies defined over a substrate.

FIG. 2 is a schematic top plan view showing a plurality of dies defined over a substrate. The substrate 200 comprises a plurality of dies 203 defined thereover. At least one of the dies 203 comprises a die area 210 and a surrounding area 220, where at least one protective structure (not shown in FIG. 2) is formed. The dies 203 are separated by a plurality of vertical and horizontal scribe lines (not shown). The scribe lines are provided for formation of test structures therein and subjected to die sawing during singulation. The numeral 230 indicates an intersection of two perpendicular scribe lines. Detailed descriptions of the intersection are provided below.

The substrate 200 can be a silicon substrate, III-V compound substrate, display substrate such as a liquid crystal display (LCD), plasma display, electro luminescence (EL) lamp display, or light emitting diode (LED) substrate (collectively referred to as, substrate 200), for example. In the die area 210, various devices, diodes and/or circuits are formed. Each of the die areas 210 may also comprise at least one pad (not shown) which is formed over the substrate 200 and provided for bonding with another pad (not shown) formed over another substrate (not shown).

Figure 1C:
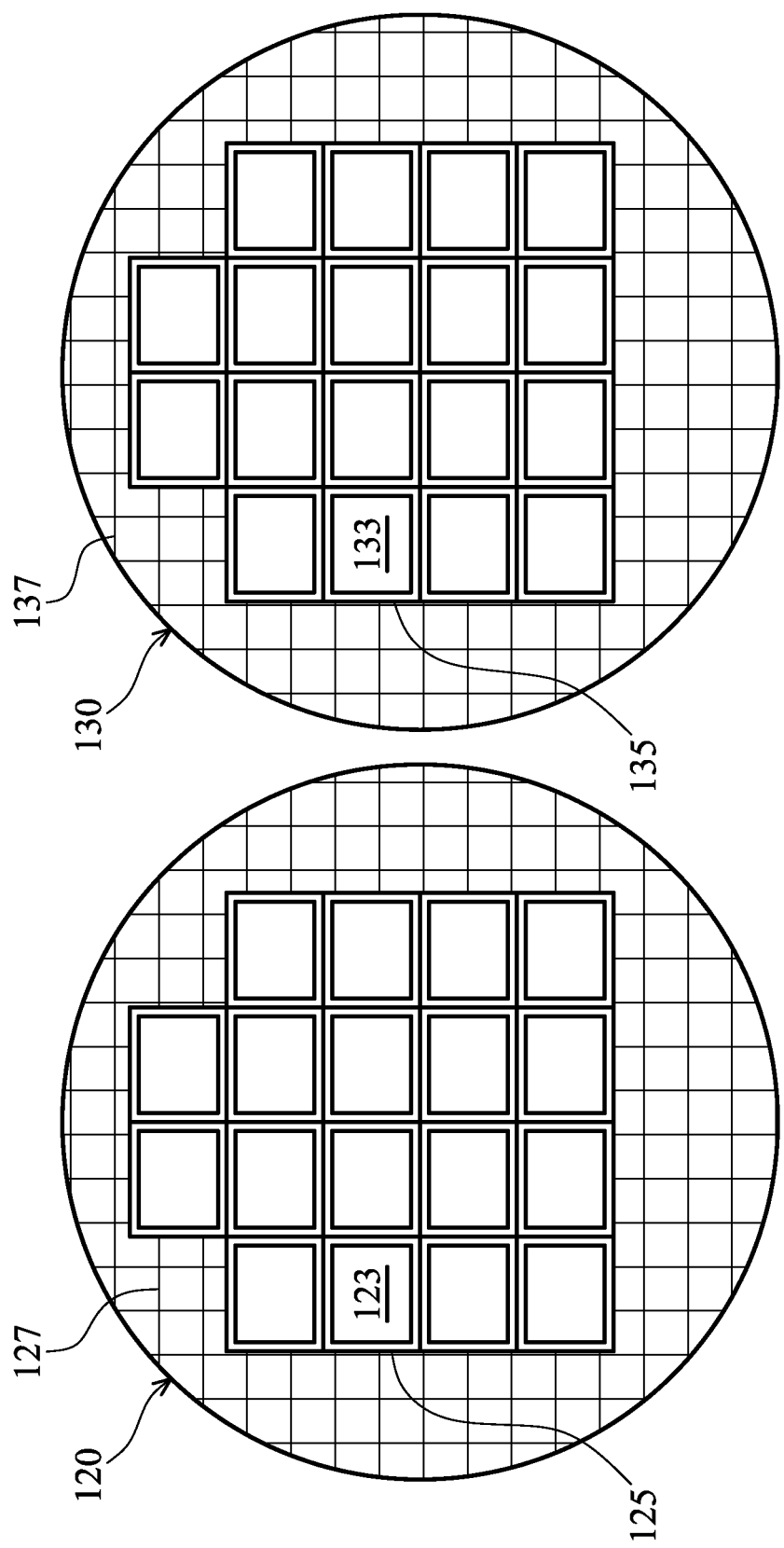
FIG. 1C is a top plan view of two wafers to be stacked, and upon which different dies are formed.
Figure 1D:
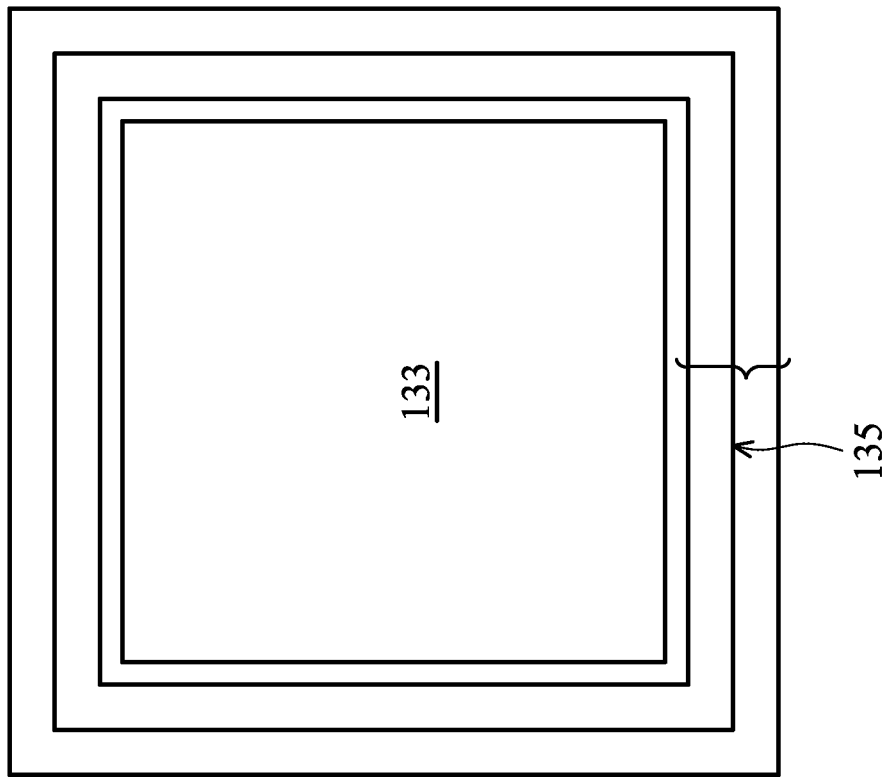
FIG. 1D is an enlarged view of dies 123 and 133 shown in FIG. 1C.
Figure 1D:
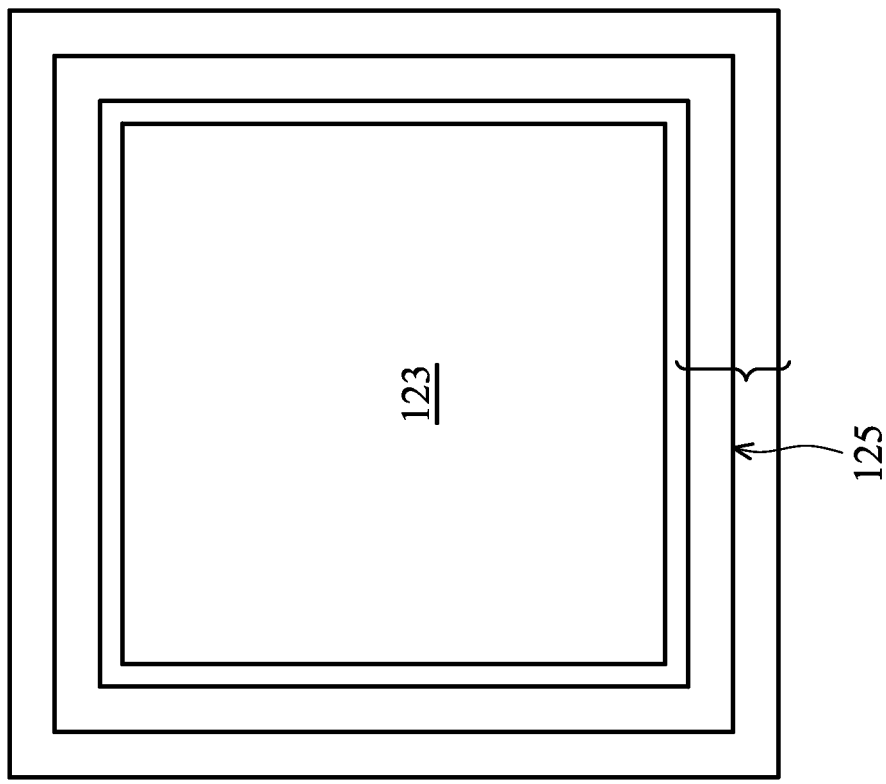

In some embodiments, the pattern of the die 210 is repeatedly defined across the substrate 200 by using the same set of reticles in manufacturing the devices, diodes, circuits and/or protective structures. The peripheral area of the substrate 200 is also subjected to the same processing steps and pattern as provided in the central area of the substrate 200. Though incomplete dies may let chemicals and debris flow into die areas thereof, the protective structures (not shown) formed around the die areas still desirably block the chemicals at the peripheral areas. Compared with a process forming different patterns in die areas and peripheral areas of a substrate as described above with reference to FIGS. 1C and 1D, the embodiments shown in FIG. 2 do not need to use an additional mask or reticle for forming a different pattern at the peripheral region of the substrate 200. Accordingly, the manufacturing costs and cycle time for forming the die pattern across the substrate 200 are thus reduced. In still other embodiments, different patterns are defined in the peripheral area in view of cooperating protective structures described below in connection with FIGS. 3A-3B, 4A-4B and 5A-5E.

Referring again to FIG. 2, after formation of the dies 210, the substrate 200 is then bonded with another substrate (not shown) upon which similar or different devices, diodes, circuits and/or protective structures are formed. The definition of die patterns over the other substrate may be the same as, or similar to, that of the substrate 200. The bonding of the substrate 200 and the other substrate is described in detail below.

Following is a description regarding a first exemplary protective structure.

Figure 3A:
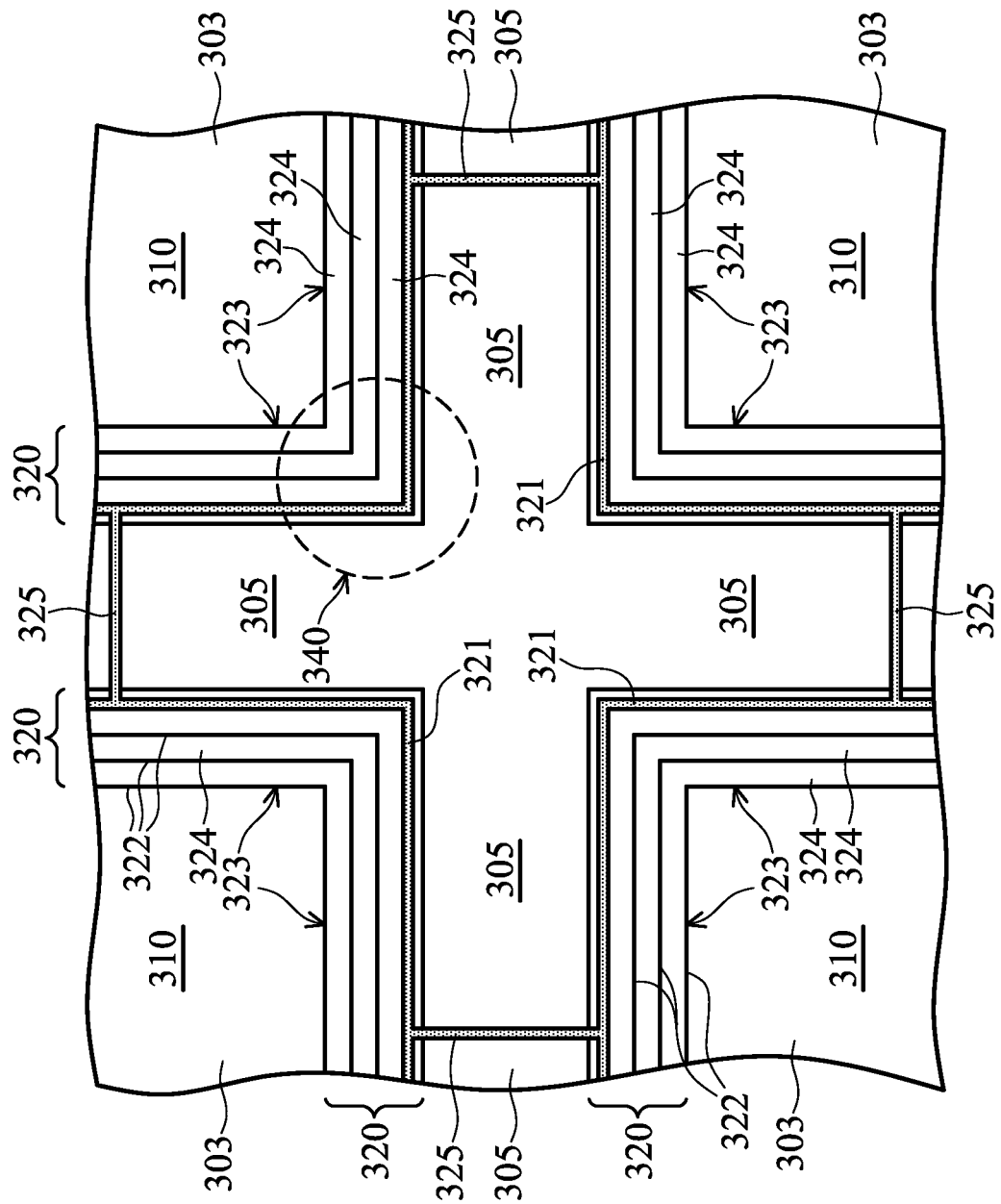
FIG. 3A is an enlarged view of the intersection region 230 of FIG. 2.

FIG. 3A is an enlarged view of the intersection region 230 of FIG. 2. In FIG. 3A, like items are indicated by reference numerals having the same value as in FIG. 2, increased by 100. As shown in this figure, the dies 303, at least one of which comprises the die area 310 and the surrounding area 320, are separated by scribe lines 305 upon which various test patterns are formed for measuring device electrical or physical characteristics. Reference numeral 340 indicates a corner region of the die 303, e.g., the surrounding area 320, where the protective structures 323 are formed.

Referring to FIG. 3A, protective structures 323 are formed within the areas 320 around the die areas 310. The protective structures 323 may comprise, for example, at least one of a dielectric layer (e.g., oxide, nitride, oxynitride or the like), a conductive layer (e.g., aluminum (Al), copper (Cu), AlCu or the like), combinations thereof, or the like. The protective structures 323 may extend over the surface of the die areas 310 (e.g., the protective substrate 623 shown in FIG. 6A) such that the protective structures 323 contact corresponding protective structures (not shown) formed over another substrate (not shown). In some embodiments, at least one of the protective structures 323 may comprise a plurality of rings 321, 322. The rings 321, 322 may have the same width and be separated by the same space 324. At least one of the rings 321, 322 may have a width of about 2 μm or more. In addition, the space 324 between two neighboring rings 321, 322 may be about 2 μm or more. The protective structures 323 are formed and connected with corresponding protective structures (not shown) formed over another substrate (not shown) which is bonded thereto. Since the protective structures 323 are formed around the die area 310 and bonded with corresponding protective structures formed over another substrate, the bonded protective structures can seal the die area 310 and protect the die area 310 from being contaminated or damaged by chemicals, e.g., acid, base or dionized (DI) water, flowing through the scribe lines 305, while the bonded substrates are subjected to a processing step, such as a grinding step. Detailed descriptions are provided below in connection with FIGS. 6A-6E. Also, the number of the rings 321, 322 is not limited to that shown in FIG. 3A. More or fewer than two rings may be used in order to obtain a desired protective result for the die areas 310.

In some embodiments, the outer ring 321 of the rings may be wider than the others 322 as shown in FIG. 3A. The wide ring 321 is more robust in preventing chemical penetration than a thin ring 322. Accordingly, even if chemicals may flow within the scribe lines 305, the wide outer ring 321 cooperating with another outer ring 325 bonded thereover may still desirably protect the sealed die 310 from being damaged.

Referring again to FIG. 3A, additional protective structures 325 are formed within the scribe lines 305, extending from one side of the protective structure 323 around one die area 310 to the adjacent protective structure 323 around an adjacent die area 310. Although the example in FIG. 3A shows the structure 325 being perpendicular to the scribe line, the structure 325 may alternatively be formed at an angle other than 90 degrees. The protective structures 325 are bonded with corresponding protective structures (e.g., structure 425 as shown and described below with reference to FIG. 4A) formed over another substrate. These bonded protective structures (including 305) thus divide the scribe lines 305 into two or more regions, at least one of which is defined by the outer ring 321 of the rings 323 and the protective structures 325. In other words, a single vertical or horizontal scribe line 305 is divided into several regions separated by the protective structures 325. With the individually isolated scribe line region as shown in FIG. 3A, the protective structures 325 can more effectively prevent flowing of chemicals along the scribe line, from one region within the scribe line 305 to another region thereof, even if one of the protective structures 325 is damaged and fails to contact with another protective structure (not shown) bonded thereover. In some embodiments, the protective structures 325 are preferably formed across the scribe lines 305 at regions adjacent to the mid-edge of the dies 303 to achieve the desired isolation result. In some embodiments, the protective structures 325 may have a width of about 2 μm or more. The protective structures 325, however, are not limited to the description and drawing described above.

Dimensions, number and shape of the protective structures 325 can be modified in order to achieve a desired isolation result in the scribe line 305. For example, at least one of die 303 may comprise only one or more protective structures 325. One side of the protective structure 325 may comprise two or more protective structures 325. According to the descriptions above, one of ordinary skill in the art, therefore, can readily modify the protective structures 325.

Following is a description of a second exemplary protective structure.

Figure 3B:
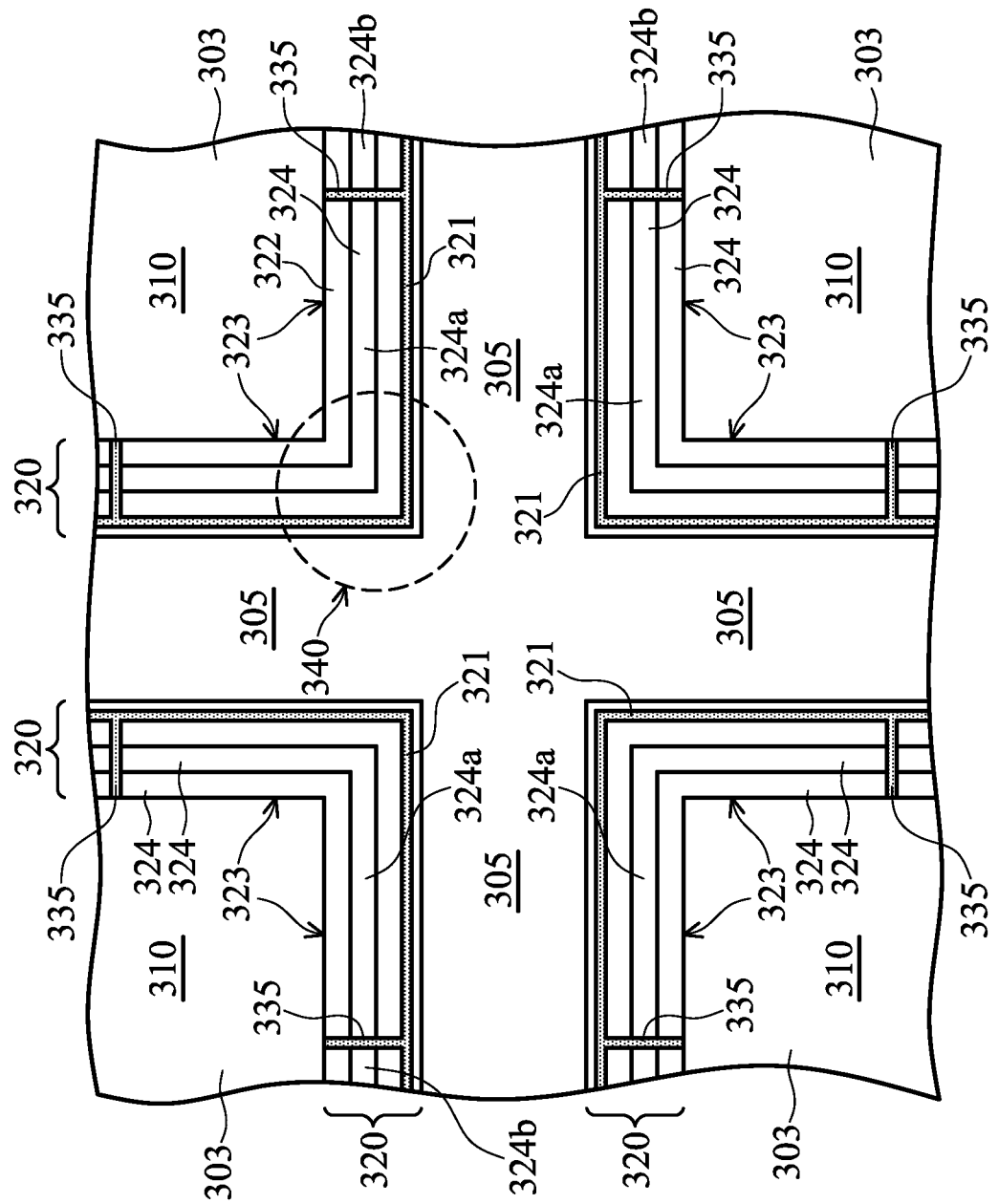
FIG. 3B is an enlarged view of the intersection region 230 of FIG. 2.

FIG. 3B is an enlarged view of the intersection region 230 of FIG. 2. In FIGS. 3A and 3B, like items are indicated by reference numerals having the same value.

Referring to FIG. 3B, the rings 321, 322 of the protective structures 323, are connected to each other by at least one protective structure 335, dividing the space 324 into a plurality of compartments (e.g., 324a, 324b). Although the example in FIG. 3A shows the structure 335 being perpendicular to the scribe line, the structure 335 may alternatively be formed at an angle other than 90 degrees. As shown in this figure, at least one of the spaces 324 between two rings 321, 322 is divided into at least two regions by the protective structures 335. The protective structures 335 are provided to bond with corresponding protective structures (e.g., structure 423 shown in FIG. 4A) formed over the mating substrate of the stacked wafer assembly, thereby forming isolated, sealed compartments (e.g., 324a, 324b) in the spaces 324 between the rings 321, 322. The sealed compartments 324a, 324b provide desired isolation results for individual spaces 324. For example, if the corner region 340 cracks and chemicals flow therein, chemicals will be confined within the compartment 324a, 324b defined by the rings 321, 322 that are damaged and the protective structures 335 such that chemicals will not flow and surround the die area 310 through the spaces between the rings. In some embodiments, the protective structures 335 may have a width of about 2 μm or more. The protective structures 335, however, are not limited to the description and drawings described above. Dimensions, number and shape of the protective structures 335 can be modified in order to achieve a desired isolation in the surrounding areas 320.

In other embodiments, a substrate may comprise both of the protective structures 325 and 335 formed thereover. This substrate is then bonded to a corresponding substrate having protective structures corresponding to the protective structures 325 and 335, so as to further protect the dies 303.

Following is a description of a third exemplary protective structure.

Figure 4A:
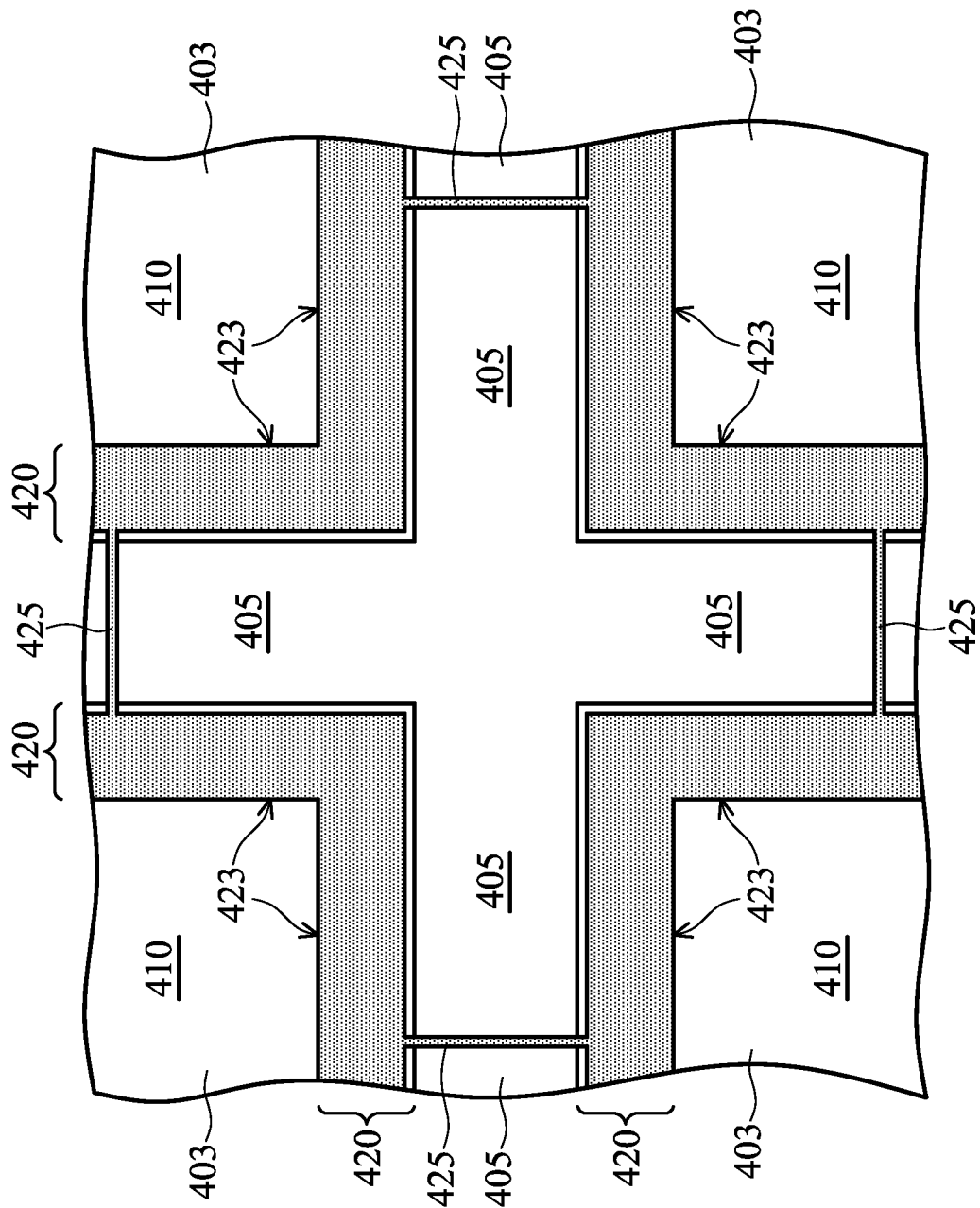
FIG. 4A is an enlarged view of the intersection region 230 of FIG. 2.

FIG. 4A is an enlarged view of the intersection region 230 of FIG. 2. In FIG. 4A, like items are indicated by reference numerals having the same value as in FIG. 3A, increased by 100.

Referring to FIG. 4A, the protective structure 423 comprises a single ring which has a width of about 6 μm or more. The protective structure 423 is provided to bond with corresponding protective structures (such as those shown in FIGS. 3A and 3B) including one or more rings 321, 322 formed over the mating substrate 200 (shown in FIGS. 2, 3A and 3B). When the two substrates are bonded together, the wide ring 423 forms a bridge over the rings 321, 322 and the space 324, sealing the space 324. In some embodiments, the width of the protective structures 423 is sufficient to prevent chemicals from flowing into the die areas 410. In addition, the protective structures 423 may be desirably bonded with other protective structures (such as, but not limited to, those shown in FIGS. 2, 3A and 3B) without a precise alignment. For example, the substrate 200 shown in FIG. 3A may be bonded with the substrate shown in FIG. 4A. The protective structures 323, 325 are bonded to the protective structures 423, 425, respectively. The width of the protective structures 423 is approximately the sum of the widths of the rings 321, 322 and the spaces 324 therebetween. Thus, the protective structures 423 can be easily bonded without a precise alignment between the corresponding protective structures on the two mating substrates. Detailed descriptions are provided below in connection with FIGS. 6A-6E.

Figure 4B:
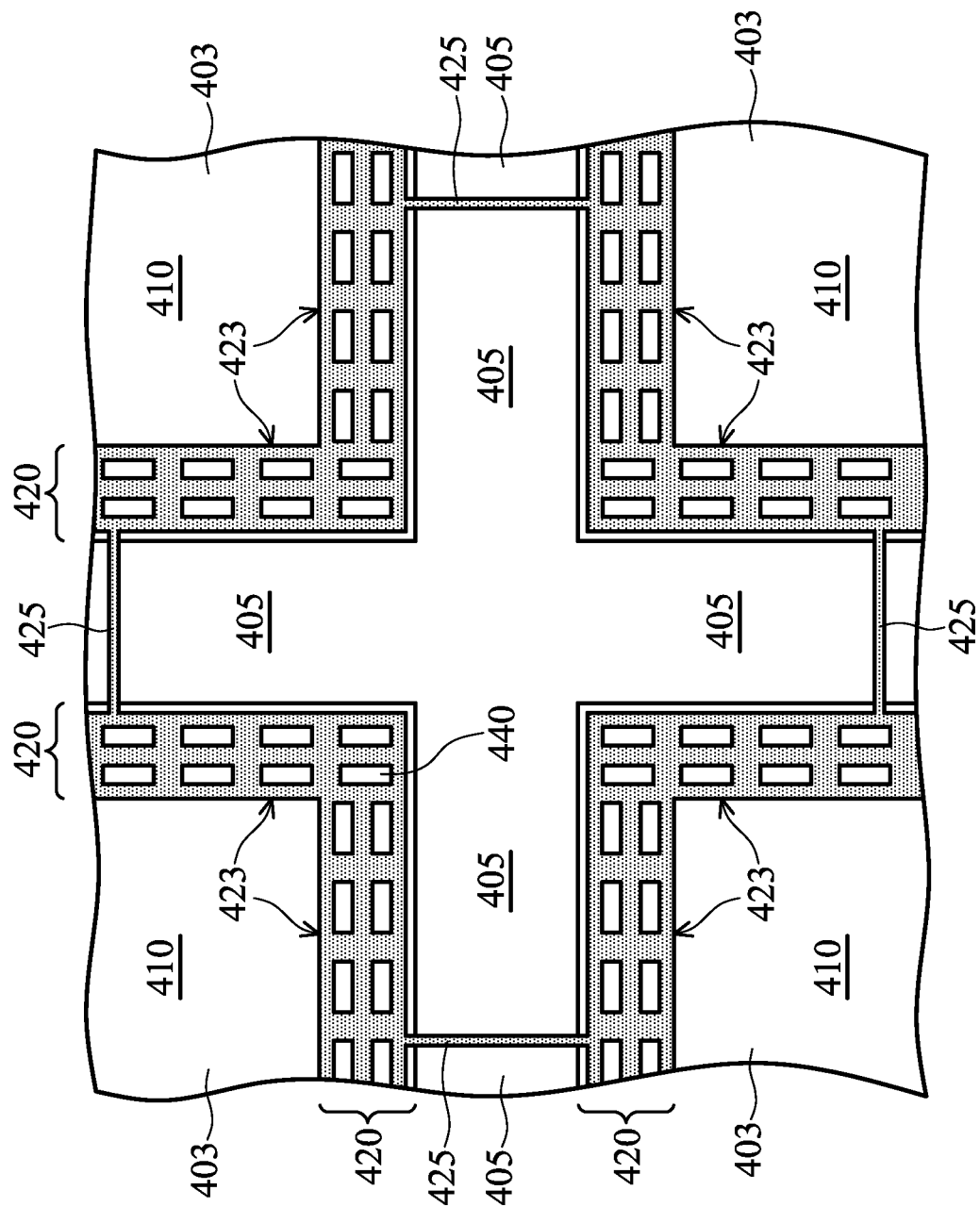
FIG. 4B is an enlarged view of the intersection region 230 of FIG. 2.

Referring now to FIG. 4B, in some embodiments, the protective structures 423 may comprise a plurality of openings 440, in which materials different from that of the protective structures 423 are formed. For example, the protective structure 423 may comprise a wide Cu ring. The Cu ring may be formed by a Cu electrical plating step and a Cu chemical mechanical planarization (CMP) step, for example. After the Cu CMP step, dishing of the Cu ring may occur due to its width and mechanical properties. Dishing of the Cu ring may adversely affect the bonding of the protective structures 423 and other protective structures (not shown) formed over another substrate (not shown). Accordingly, the openings 440 in which an oxide layer, nitride layer, oxynitride layer, dielectric layer, low-k dielectric layer, combinations thereof or the like, is formed are provided to reduce or prevent the dishing effect of the wide Cu ring. In some embodiments, the openings 440 may be a circle, oval, triangle, square, rectangle, hexagon, octagon, combinations thereof or the like. The openings 440 may have a dimension (e.g., length, width or radius) of about 2 μm or more. Spaces between the openings 440 may be about 2 μm or more. This is only one example, and the openings may have other sizes, or may be arranged in one, two, three or more rows.

Any two substrates comprising the protective structures described in connection with FIGS. 3A-3B and 4A-4B can be bonded to each other to seal the die areas 310 and 410 formed thereover, if the protective structures 325, 335 and 425 are desirably bonded with corresponding protective structures. In some embodiments, two substrates having the same protective structures may be bonded to achieve a desired protection for the die areas 310 and 410.

FIGS. 5A-5E are enlarged drawings of several variations of the corner region 340 shown in FIG. 3A. In FIGS. 5A-5E, like items are indicated by reference numerals having the same value as in FIG. 3A, increased by 200.

Figure 5B:
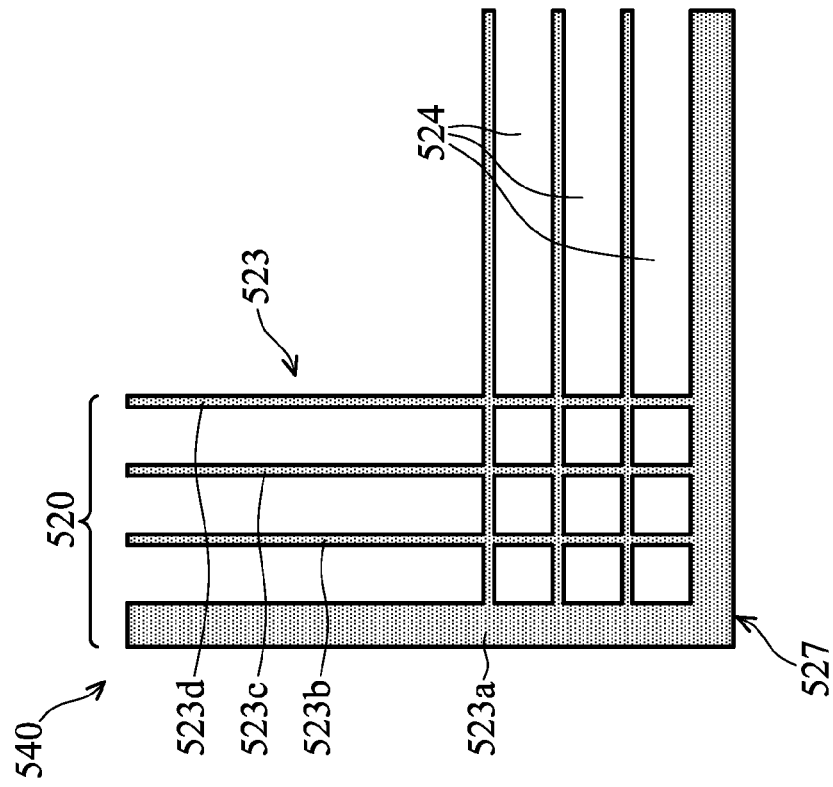
FIGS. 5A-5E are enlarged drawings of the corner region 340 shown in FIG. 3A.
Figure 5A:
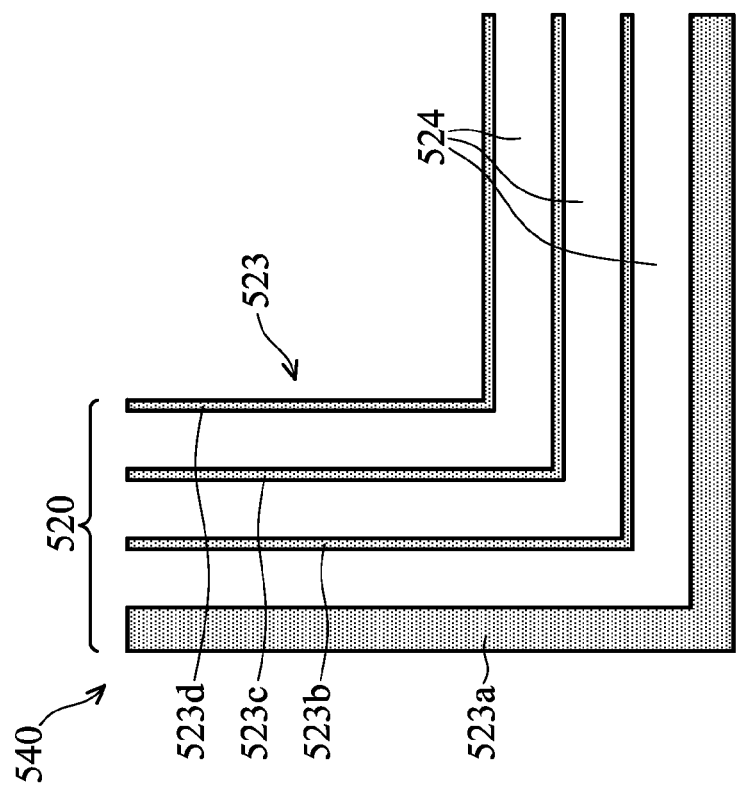

As shown in FIG. 5A, the protective structure 523 comprises a plurality of rings 523a-523d with spaces 524 therebetween. In this figure, the outer ring 523a is wider than the other rings 523b-523d. As described above, the wide outer ring 523a can further protect the die area (not shown) from being contaminated or damaged by chemicals flowing within scribe lines (not shown).

As described above, the protective structures 523 including the rings 523a-523d are bonded to other protective structures (not shown) formed over a corresponding substrate (not shown in FIGS. 5A-5E). When being bonded, the mating substrates are subjected to a bonding force and thermal cycle. In addition, the corner region 540 is a stress-concentrating region, which is susceptible to cracking. During or after the bonding step and the CMP step, the corner region 540 may be cracked and damaged. Accordingly, chemicals may flow into the die area of the bonded structures at the cracked corner region 540. In order to reduce or eliminate this issue, various designs are provided in FIGS. 5B-5E.

Referring to FIG. 5B, a protective structure 527 is formed at the corner region 540. In this figure, the protective structure 527 connects the rings 523a-523d to each other. In other words, the protective structure 527 is formed by extending ends of at least one side of the rings 523b-523d to the outer ring 523a. In some embodiments, the protective structure 527 is in a form of matrix, at least one region within the matrix being isolated from another. Therefore, if one or some of the regions adjacent to the outer ring 523a cannot be sealed due to the cracking of the corner region 540, the other sealed regions which are near to the die area (not labeled) can still provide a desired protective result against chemical contamination or damage.

Figure 5D:
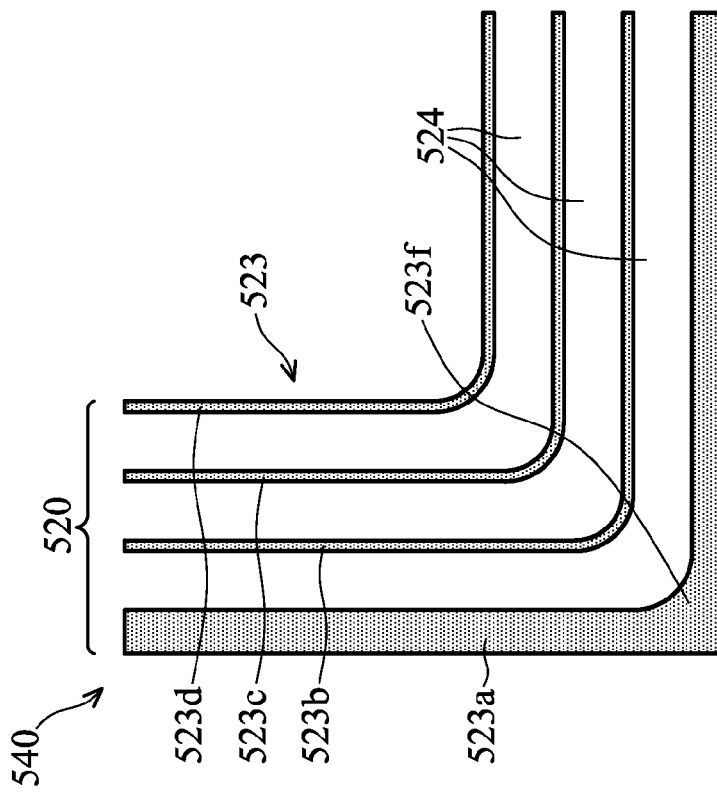
Figure 5C:
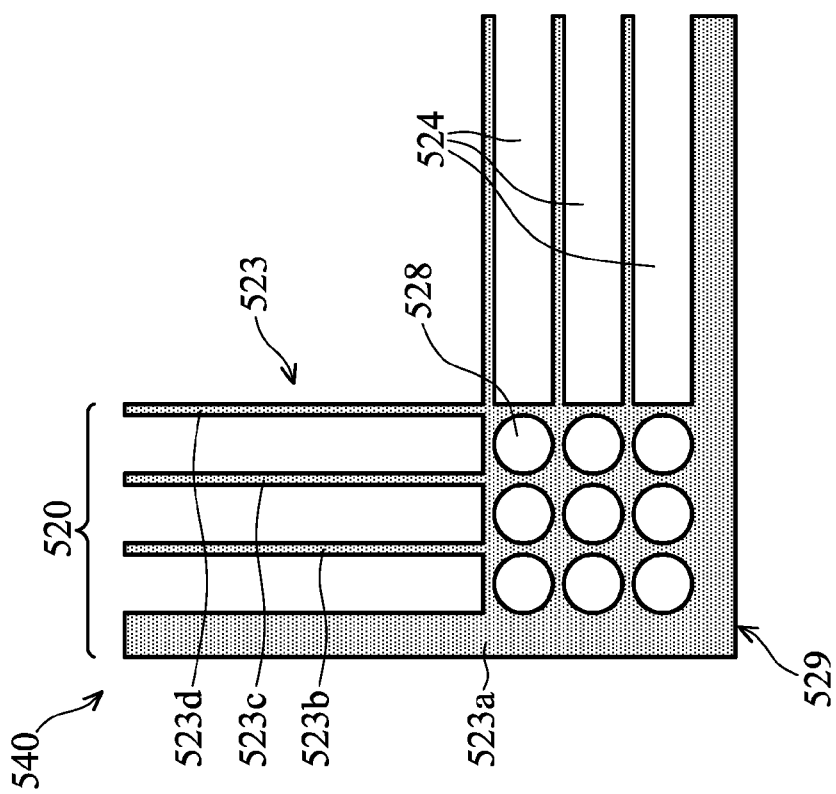

As shown in FIG. 5C, the protective structure 529 comprises a plurality of openings 528, and at least one of the openings 528 has rounded corners, which can more effectively prevent or reduce cracking at the corner 540 resulting from a bonding step and/or CMP processing step.

As shown in FIG. 5D, in some embodiments, at least one of the rings 523a-523d of the protective structures 523 has a rounded corner. Any one or more of the rings 523a-523d may be rounded. In other embodiments, there are two or more rings having rounded corners. As shown in FIG. 5D, all the rings 523a-523d have rounded corners, which may desirably reduce or prevent cracking of the bonded structures.

Figure 5E:
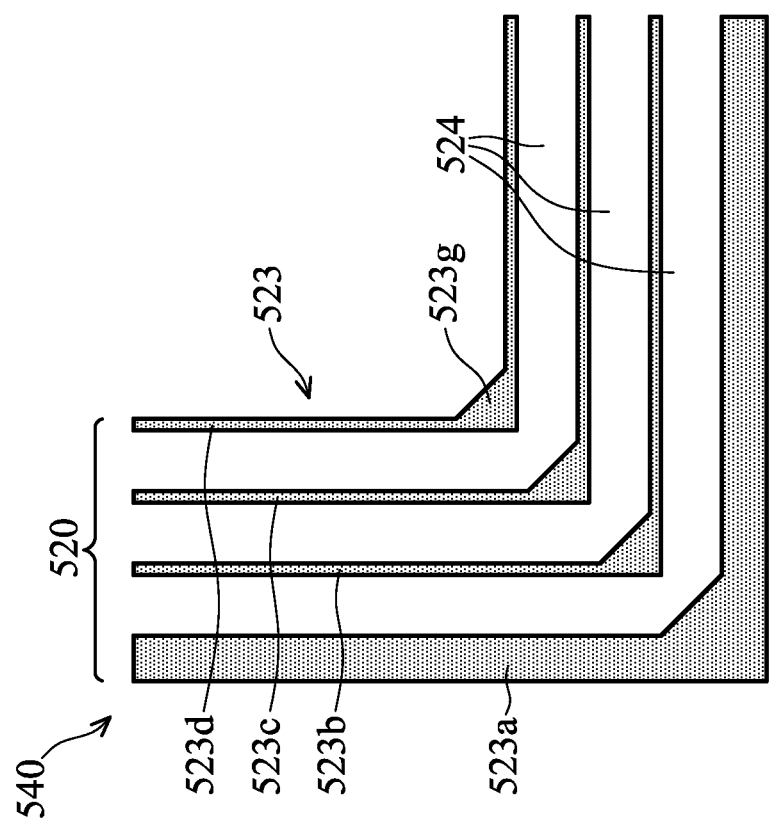

As shown in FIGS. 5D and 5E, in some embodiments, at least one of the rings 523a-523d of the protective structures 523 has a fillet 523f, 523g at the corner. The fillets 523f, 523g may be straight (e.g., fillets 523g in FIG. 5E) or rounded (e.g., fillets 523f in FIG. 5D). With the fillets 523f, 523g, the protective structure 523 can more desirably prevent or reduce cracking of the bonded structures.

It is noted that the scope of the protective structures at the corner 540 is not limited to the drawings shown in FIGS. 5B-5E. Any structures with any shape and dimension that can desirably reduce or prevent cracking of bonded structures at corners of dies can be applied.

FIGS. 6A-6E are schematic cross-sectional views of a method for forming stacked substrates.

Figure 6A:
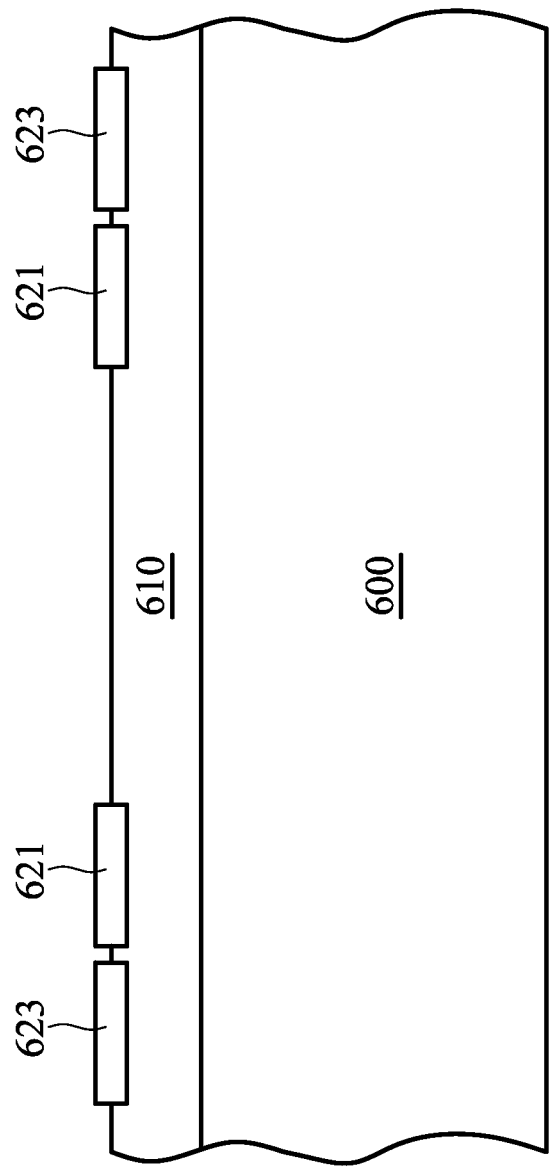
FIGS. 6A-6E are schematic cross-sectional views of forming stacked substrates.

As shown in FIG. 6A, a substrate 600 may comprise a multi-level interconnect structure 610 formed thereover. The substrate 600 may be the same as or similar to the substrate 200 described above in connection with FIG. 2. The multi-level interconnect structure 610 may comprise, for example, at least one conductive layer (not shown) (e.g., metal layers, vias, contacts, damascene structures, dual damascene structures, combinations thereof, or the like) and at least one dielectric layer (not shown) (e.g., oxide layer, nitride layer, oxynitride layer, low-k dielectric layer, combinations thereof, or the like). The multi-level interconnect structure 610 is formed to provide interconnection among the diodes, devices and/or circuits (not shown) formed over the substrate 600. The devices, diodes, circuits (not shown) and the multi-level structure 610 can be formed, for example, by photolithographic processing steps, etch processing steps, implantation processing steps, metallization processing steps, deposition processing steps, cleaning processing steps or combinations thereof or the like.

Referring again to FIG. 6A, pads 621 and protective structures 623 are formed over the multi-level interconnect structure 610. The pads 621 may comprise, for example, a Cu layer, Al layer, AlCu layer, combinations thereof or the like, and can be formed by a CVD processing step, PVD processing step, electrochemical plating step, electroless plating step, combinations thereof or the like. The protective structures 623 may be the same as or similar to those described above in connection with FIGS. 3A-3B, 4A-4B and 5A-5E.

Figure 6B:
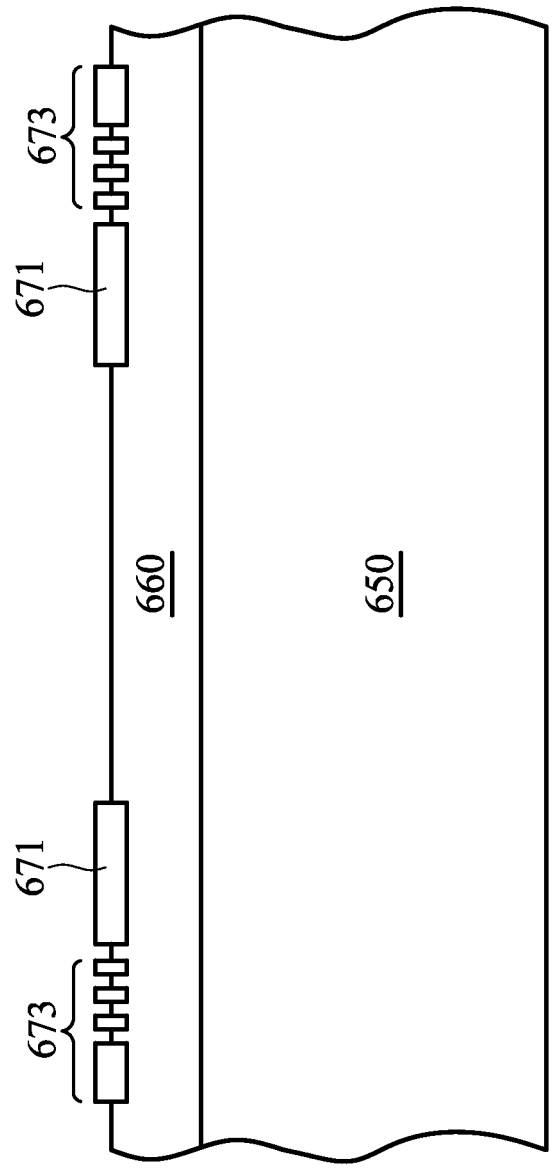

Referring to FIG. 6B, substrate 650, multi-level interconnect structure 660, pads 671 and protective structures 673 may be the same as or similar to the substrate 600, multi-level interconnect structure 610, pads 621 and protective structures 623, respectively. Alternatively, the protective structures 623 and 673 may have a different structure, and can be any of the protective structures set forth in connection with FIGS. 3A-3B, 4A-4B and 5A-5E.

Figure 6C:
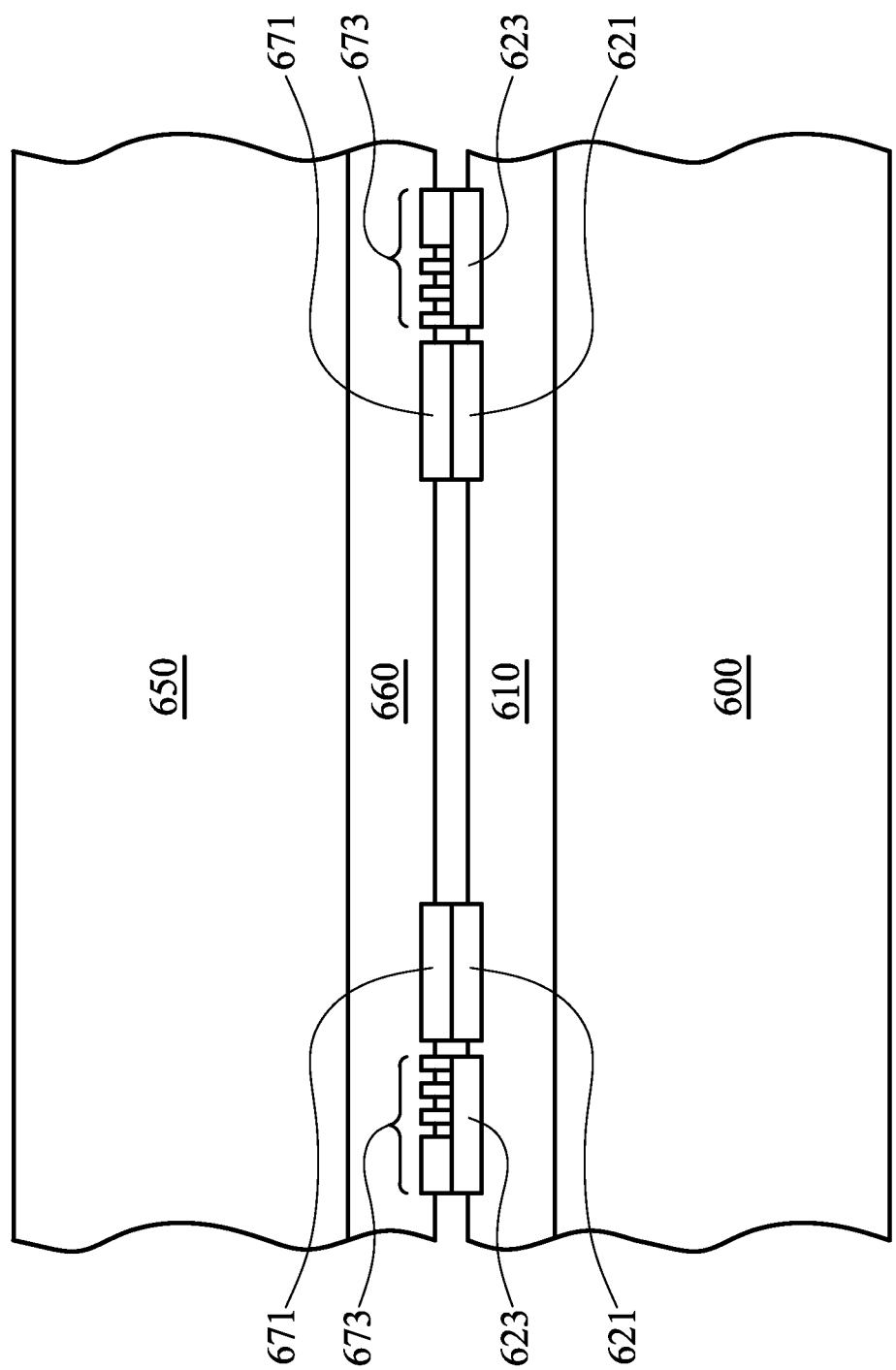

The substrate 650 is then flipped and bonded over the substrate 600 by bonding the pads 621 and 671. Meanwhile, the protective structures 623 and 673 are bonded to each other as shown in FIG. 6C. The bonding step may comprise, for example, a fusion bonding step, thermal processing step, plasma processing step, combinations thereof or the like.

Figure 6D:
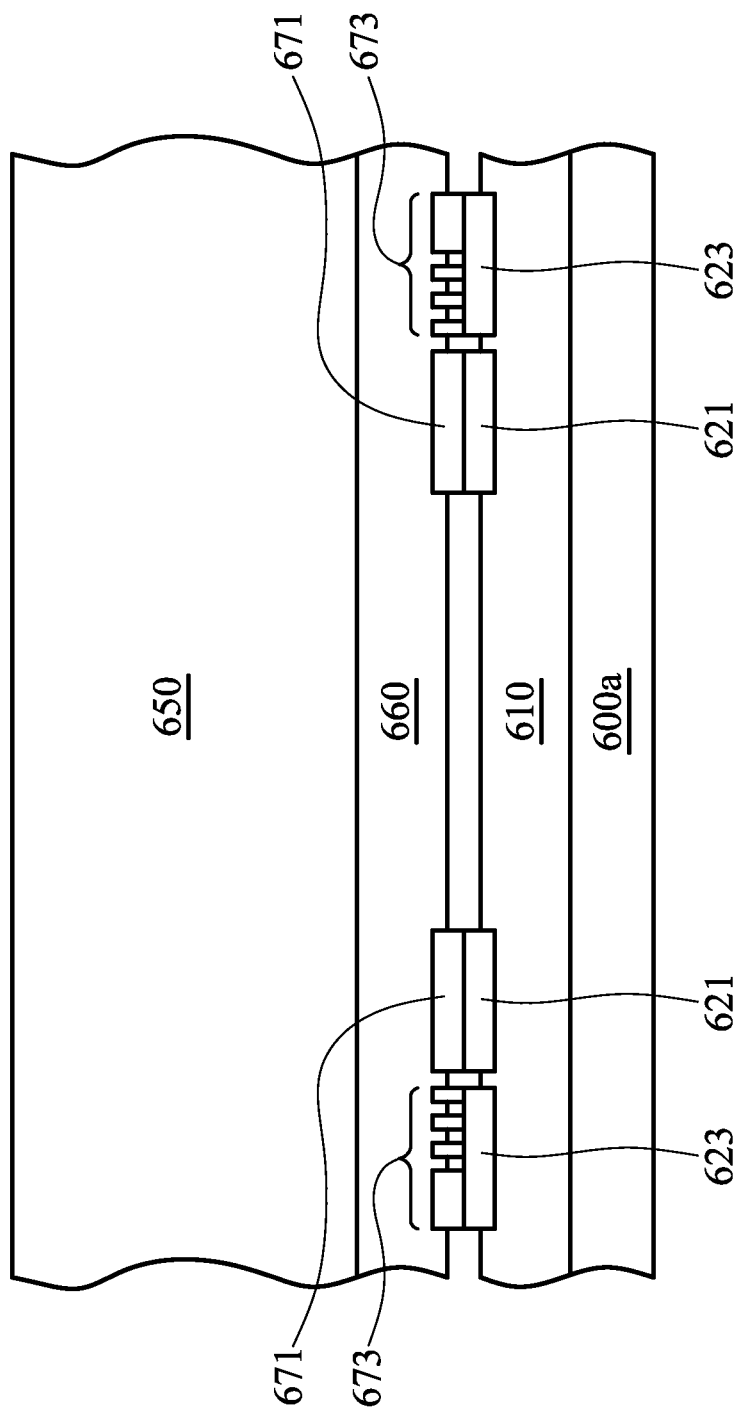
Figure 6E:
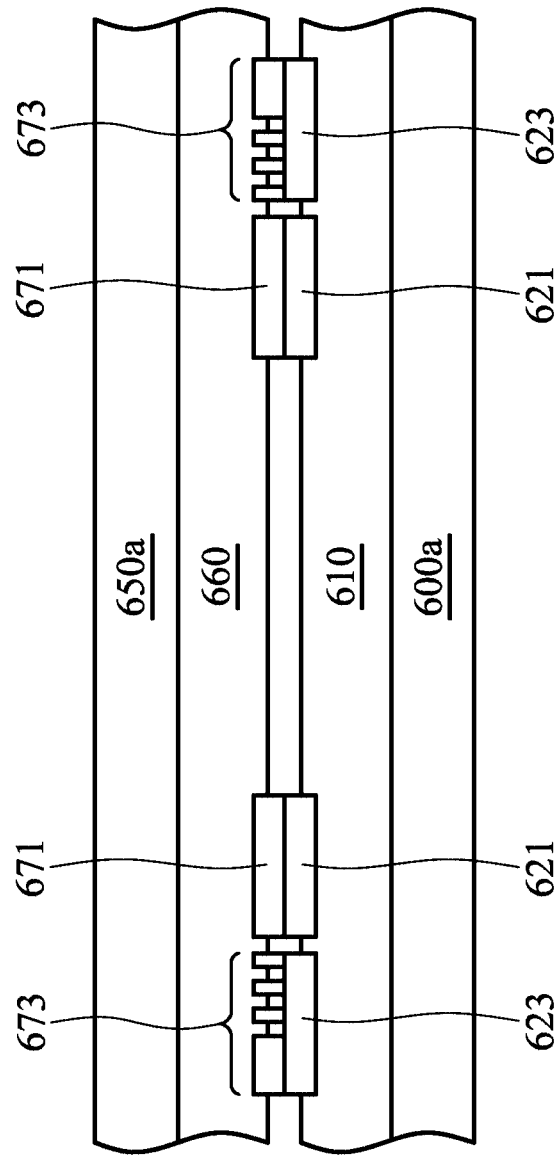

The back surfaces of the stacked substrates 600 and 650 are then subjected to a substrate grinding step, e.g., a chemical-mechanical planarization (CMP) processing step, for thinning the stacked substrates 600 and 650 as shown in FIGS. 6D and 6E. As described above, the bonded protective structures 623 and 673 are formed around die areas (not shown) including the pads 621 and 671. With the bonded protective structures 623 and 673, circuits, devices (not shown) and pads 621 and 671 formed within the die areas (not labeled) are shielded from contamination and damage resulting from debris or chemicals used in the CMP step. In addition, since the width of the single protective structures 623 is approximately equal to the sum of widths of the multi-ring protective structures 673, the protective structures 623 and 673 can be desirably bonded without a misalignment concern. In other words, the bonded protective structures 623 and 673 can still prevent debris or chemical contamination, as long as the protective structures 623 and 673 are not completely offset from each other (i.e., as long as there is some overlap between structures 623 and 673).

After the grinding step, the stacked substrates 600a and 650a are subjected to a dicing step for forming individual stacked dies. In some embodiments, before sawing the stacked substrates 600a and 650a, at least one contact structure (e.g., via through wafer (VTW)) is formed through at least one of the stacked substrates 600a and 650a, providing thermal dissipation and/or electrical connection with another substrate (not shown) upon which the stacked substrates 600a and 650a is bonded.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A method, comprising:
    forming a plurality of first dies over a first surface of a first substrate, at least one of the first dies comprising a first die area and at least one first protective structure positioned around at least one of the first die areas, at least one side of the first protective structure having one first extension part extending to another first protective structure positioned around another first die area adjacent thereto;
    forming a plurality of second dies over a second surface of a second substrate, at least one of the second dies comprising a second die area and at least one second protective structure positioned around at least one of the second die areas, at least one side of the second protective structure having one second extension part extending to another second protective structure positioned around another second die area adjacent thereto;
    bonding the first surface of the first substrate with the second surface of the second substrate thereby connecting the first extension part and the second extension part, wherein the first extension part and the second extension part divide a scribe line channel formed between the first and second substrates after bonding into at least two isolated scribe line channels that are fluidly sealed from one another; and
    dicing the first substrate and the second substrate bonded thereover.

2. The method of claim 1, wherein the at least one first protective structure includes at least one outer ring and at least one inner ring.

3. The method of claim 2, wherein the at least one outer ring is wider than the at least one inner ring.

4. The method of claim 3, further comprising forming at least one third protective structure at corners of the at least one outer ring and at least one inner ring to connect the at least one outer ring and the at least one inner ring.

5. The method of claim 4, wherein the third protective structure includes a matrix which comprises a plurality of openings, and at least one of the openings has rounded corners.

6. The method of claim 1, wherein at least one of the first protective structure and the second protective structure includes a single ring having a width of about 6 microns or more.

7. The method of claim 6, further comprising forming at least one opening within the single ring.

8. A method of forming stacked structures, comprising:
    forming a plurality of first dies over a first surface of a first substrate, at least one of the first dies comprising a first die area and at least one first protective structure disposed around at least one of the first die areas, at least one side of the first protective structure having one first extension part extending to another first protective structure disposed around another first die area adjacent thereto;
    forming a plurality of second dies over a second surface of a second substrate, at least one of the second dies comprising a second die area and at least one second protective structure disposed around at least one of the second die areas, at least one side of the second protective structure having one second extension part extending to another second protective structure disposed around another second die area adjacent thereto;
    bonding the first surface of the first substrate to the second surface of the second substrate thereby connecting the first extension part and the second extension part, wherein the first extension part and the second extension part divide a scribe line channel formed between the first and second substrates after bonding into at least two isolated scribe line channels that are fluidly sealed from one another;
    thinning at least one of the first substrate and the second substrate bonded thereover; and
    dicing the first substrate and the second substrate bonded thereover.

9. The method of claim 8, wherein at least one of the first protective structure and the second protective structure includes a plurality of rings.

10. The method of claim 9, further comprising forming at least one third protective structure connected to at least one side of the plurality of rings and that connects the plurality of rings.

11. The method of claim 9, wherein an outer ring of the plurality of rings is wider than an inner ring of the plurality of rings.

12. The method of claim 9, further comprising forming at least one third protective structure at corners of the rings for connecting the rings.

13. The method of claim 12, wherein the third protective structure includes a matrix which comprises a plurality of openings, and at least one of the openings has rounded corners.

14. The method of claim 9, further comprising forming at least one of the plurality of rings such that it has a rounded corner.

15. The method of claim 9, further comprising forming at least one of the plurality of rings such that it has a fillet at a corner thereof.

16. The method of claim 8, wherein at least one of the first protective structure and the second protective structure includes a single ring having a width of about 6 microns or more.

17. The method of claim 16, further comprising forming at least one opening within the single ring.

18. A method, comprising:
- forming a plurality of first dies over a first surface of a first substrate, at least one of the first dies comprising a first die area and at least one first protective structure disposed around at least one of the first die areas, at least one side of the first protective structure having one first extension part extending to another first protective structure disposed around another first die area adjacent thereto;
- forming a plurality of second dies over a second surface of a second substrate, at least one of the second dies comprising a second die area and at least one second protective structure disposed around at least one of the second die areas, at least one side of the second protective structure having one second extension part extending to another second protective structure disposed around another second die area adjacent thereto;
- bonding the first surface of the first substrate with the second surface of the second substrate thereby connecting the first extension part and the second extension part, wherein the first extension part and the second extension part divide a scribe line channel formed between the first and second substrates after bonding into at least two isolated scribe line channels that are fluidly sealed from one another; and
- dicing the first substrate and the second substrate bonded thereover,
- wherein the at least one first protective structure includes at least one outer ring and at least one inner ring.

19. The method of claim 18, further comprising forming at least one third protective structure such that the at least one third protective structure is connected to at least one side of the at least one outer ring and to the at least one inner ring.

20. The method of claim 18, further comprising forming at least one third protective structure at corners of the at least one outer ring and the at least one inner ring to connect the at least one outer ring and the at least one inner ring.

* * * * *